US012628673B2

(12) United States Patent
Chen et al.

(10) Patent No.: US 12,628,673 B2
(45) Date of Patent: May 12, 2026

(54) ELECTRONIC PACKAGE AND SUBSTRATE STRUCTURE THEREOF

(71) Applicant: SILICONWARE PRECISION INDUSTRIES CO., LTD., Taichung (TW)

(72) Inventors: Wan-Rou Chen, Taichung (TW);
Yi-Wen Liu, Taichung (TW);
Hsiu-Jung Li, Taichung (TW);
Yi-Chen Chi, Taichung (TW);
Tsung-Li Lin, Taichung (TW)

(73) Assignee: SILICONWARE PRECISION INDUSTRIES CO., LTD., Taichung (TW)

(*) Notice: Subject to any disclaimer, the term of this patent is extended or adjusted under 35 U.S.C. 154(b) by 646 days.

(21) Appl. No.: 18/063,377

(22) Filed: Dec. 8, 2022

(65) Prior Publication Data

US 2023/0230912 A1 Jul. 20, 2023

(30) Foreign Application Priority Data

Jan. 20, 2022 (TW) .................................. 111102405

(51) Int. Cl.
*H01L 23/498* (2006.01)
*H01L 23/00* (2006.01)
*H01L 25/16* (2023.01)

(52) U.S. Cl.
CPC ........ *H01L 23/49838* (2013.01); *H01L 24/16* (2013.01); *H01L 25/16* (2013.01); *H01L 24/32* (2013.01); *H01L 24/73* (2013.01); *H01L*

*2224/16227* (2013.01); *H01L 2224/32225* (2013.01); *H01L 2224/73204* (2013.01)

(58) Field of Classification Search
CPC ......... H01L 23/49838; H01L 23/49811; H01L 24/32; H01L 24/73; H01L 25/16
See application file for complete search history.

(56) References Cited

U.S. PATENT DOCUMENTS

| | | | |
|---|---|---|---|
| 2011/0001224 A1* | 1/2011 | San Antonio ....... | H01L 23/3121 257/666 |
| 2015/0214198 A1* | 7/2015 | Lee ........................ | H01L 24/97 257/676 |

\* cited by examiner

*Primary Examiner* — Lawrence C Tynes, Jr.

(74) *Attorney, Agent, or Firm* — Studebaker Brackett PLLC

(57) ABSTRACT

An electronic package is provided, which includes a substrate structure and an electronic element and a passive element disposed on the substrate structure, where a die placement area and a functional area separated from each other are defined on a surface of a substrate body of the substrate structure, so that a routing layer is arranged with linear conductive traces with a smaller width in the die placement area, and a sheet-shaped circuit with a larger width and electrically connected to the linear conductive traces is arranged in the functional area, so as to reduce a metal area on the surface of the substrate body, thereby avoiding the problem of warpage caused by stress concentration in the die placement area.

18 Claims, 4 Drawing Sheets

ELECTRONIC PACKAGE AND SUBSTRATE STRUCTURE THEREOF

BACKGROUND

1. Technical Field

The present disclosure relates to a semiconductor device, and more particularly, to an electronic package capable of reducing warpage and a substrate structure thereof.

2. Description of Related Art

With the development of the electronic industry, today's electronic products have tended to be designed in the direction of being light, thin, small, and functionally diverse, and the semiconductor packaging technique has also developed different packaging types. In order to meet the high integration and miniaturization requirements of semiconductor devices, in addition to the traditional wire bonding semiconductor packaging technique, the industry mainly uses a flip chip method to improve a wiring density of a semiconductor device.

FIG. 1A is a schematic cross-sectional view of a conventional flip-chip semiconductor package 1. As shown in FIG. 1A, a semiconductor chip 11 is first bonded onto electrical contact pads 10a of a package substrate 10 by a plurality of solder bumps 13, and then the solder bumps 13 are reflowed. Next, an underfill 14 is formed between the semiconductor chip 11 and the package substrate 10 to cover the solder bumps 13.

At least one passive element 15 is usually disposed on the package substrate 10, and the passive element 15 is electrically connected to the plurality of solder bumps 13 (or a plurality of electrical contact pads 10a as shown in FIG. 1B) of the semiconductor chip 11 via a single sheet-shaped circuit 100 of the package substrate 10. Due to the electrical requirements between the passive element 15 and the semiconductor chip 11, a sheet-shaped circuit 100 having a wider width is required as a current path, otherwise the passive element 15 (e.g., a capacitor) cannot achieve the expected function.

However, in the conventional semiconductor package 1, the sheet-shaped circuit 100 of the package substrate 10 is a large-area metal structure, which is subjected to temperature cycles or stress changes, such as passing through a reflow oven or going through tests such as dropping and other processes, the package substrate 10 is prone to uneven stress distribution due to differences (e.g., mismatches) in Coefficient of Thermal Expansion (CTE) in various regions of the surface, resulting in warpage. The warpage situation easily causes the plurality of solder bumps 13 to separate from the package substrate 10 (even breakages of the solder bumps 13 may occur), resulting in failure (such as disconnection) of the electrical connection between the semiconductor chip 11 and the package substrate 10, resulting in that a product is scraped and a product yield drops.

Therefore, how to overcome the above-mentioned drawbacks of the prior art has become an urgent issue to be solved at present.

SUMMARY

In view of the various deficiencies of the prior art, the present disclosure provides a substrate structure, comprising: a substrate body having a surface defined with a die placement area and a functional area separated from each other; and a routing layer including a plurality of linear conductive traces arranged in the die placement area and a plurality of sheet-shaped circuits arranged in the functional area and electrically connected to the plurality of linear conductive traces, wherein each of the linear conductive traces has a width less than a width of each of the sheet-shaped circuits.

The present disclosure also provides an electronic package, comprising the aforementioned substrate structure; an electronic element disposed on the die placement area and electrically connected to the plurality of linear conductive traces; and a passive element disposed on the functional area and electrically connected to the plurality of sheet-shaped circuits.

In the aforementioned electronic package, the electronic element is electrically connected to the plurality of linear conductive traces via a plurality of conductive bumps.

In the aforementioned electronic package and the substrate structure thereof, the substrate body has a thickness less than 500 micrometers. For example, the thickness of the substrate body is 300 micrometers.

In the aforementioned electronic package and the substrate structure thereof, one of the plurality of sheet-shaped circuits is connected to at least two of the plurality of linear conductive traces.

In the aforementioned electronic package and the substrate structure thereof, the routing layer is an outermost circuit layer of the substrate body.

In the aforementioned electronic package and the substrate structure thereof, the plurality of linear conductive traces are only located in the die placement area and are not formed outside the die placement area.

In the aforementioned electronic package and the substrate structure thereof, one end of the plurality of linear conductive traces is formed with a plurality of electrical connection pads located in the die placement area, and the other end is connected to the plurality of sheet-shaped circuits. For example, the width of each of the linear conductive traces is less than or equal to a width of each of the electrical connection pads, and the width of each of the electrical connection pads is less than the width of each of the sheet-shaped circuits. Further, the electronic element is electrically connected to the plurality of electrical connection pads.

In the aforementioned electronic package and the substrate structure thereof, each of the linear conductive traces is connected to each of the sheet-shaped circuits by an auxiliary circuit, and the auxiliary circuit is arranged outside the die placement area and the functional area. For example, the auxiliary circuit has a width less than or equal to the width of each of the linear conductive traces.

It can be seen from the above that, in the electronic package and the substrate structure thereof according to the present disclosure, the circuit in the die placement area is mainly designed as a linear conductive trace with a smaller line width, so as to reduce a metal area on the surface of the substrate body. Therefore, compared with the prior art, the electronic package can avoid stress concentration in the die placement area during temperature cycles or stress changes, prevent the substrate structure from warping too much, and thus avoid the problem that the conductive bumps may be broken due to being unable to withstand the stress concentration.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "lower," "inner," "outer," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 1A:
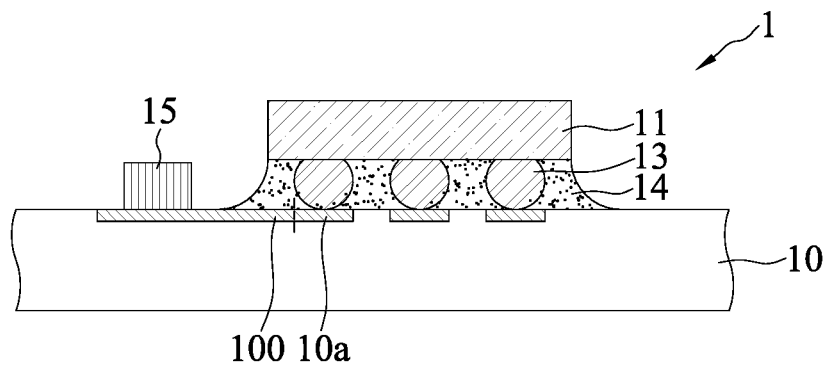
FIG. 1A is a schematic cross-sectional view of a conventional semiconductor package.
Figure 1B:
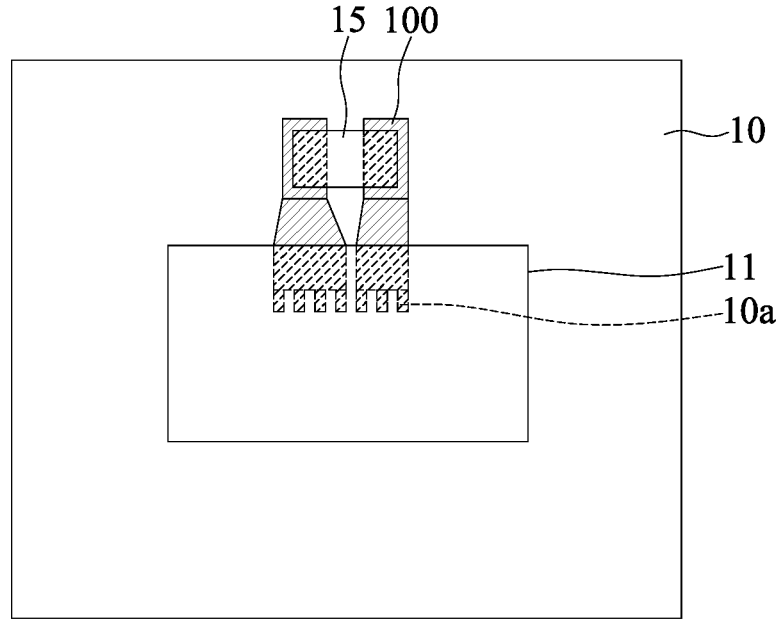
FIG. 1B is a schematic top view of the conventional semiconductor package.
Figure 2A:
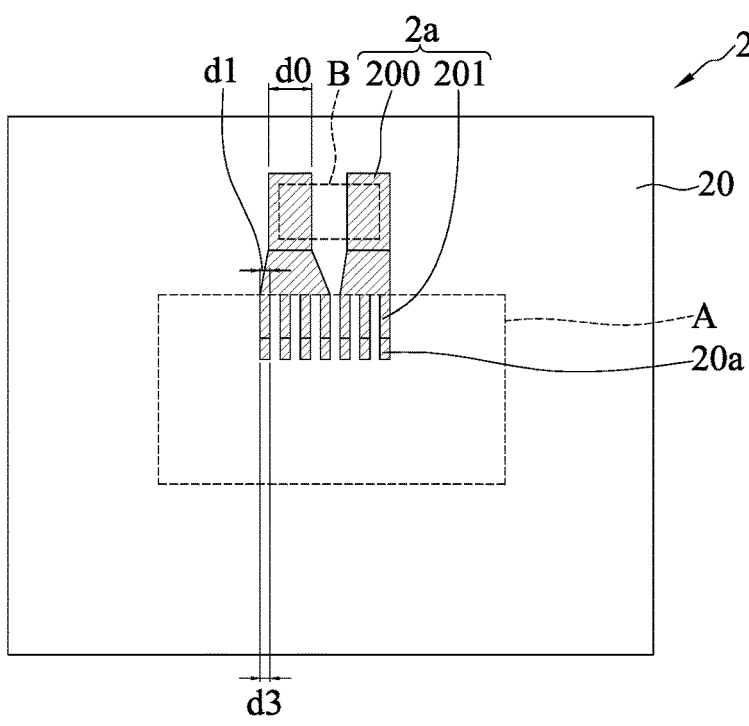
FIG. 2A is a schematic top view of a substrate structure according to the present disclosure.

FIG. 2A is a schematic top view of a substrate structure 2 according to the present disclosure. As shown in FIG. 2A, the substrate structure 2 includes a substrate body 20 and a routing layer 2a formed on the substrate body 20.

A die placement area A and a functional area B separated from each other are defined on a surface of the substrate body 20.

In an embodiment, the substrate body 20 is a package substrate with a core layer and a circuit layer or a circuit structure without a core layer (coreless). The substrate body 20 includes at least one dielectric layer (not shown) and a circuit layer (not shown) combined in the dielectric layer and electrically connected to the routing layer 2a. For example, the circuit layer and the routing layer 2a are formed by a redistribution layer (RDL) method, wherein the material for forming the circuit layer and the routing layer 2a is copper, and the material for forming the dielectric layer is a dielectric material such as polybenzoxazole (PBO), polyimide (PI), prepreg (PP) and the like.

Furthermore, a thickness t of the substrate body 20 is less than 500 micrometers (μm), preferably 300 micrometers.

The routing layer 2a is an outermost circuit layer of the substrate body 20. The routing layer 2a includes a plurality of linear conductive traces 201 arranged in the die placement area A and a plurality of sheet-shaped circuits 200 arranged outside the die placement area A and connected to the linear conductive traces 201, so that each of the sheet-shaped circuits 200 extends into the functional area B, wherein a width d1 of each of the linear conductive traces 201 is less than a width d0 of each of the sheet-shaped circuits 200 (i.e., d1<d0).

In an embodiment, a single one of the plurality of sheet-shaped circuits 200 is connected to at least two of the plurality of linear conductive traces 201. For example, an edge of one end of a single sheet-shaped circuit 200 is connected to a plurality of the linear conductive traces 201, that is, a one-to-many configuration relationship is formed.

Furthermore, one end of each of the linear conductive traces 201 is formed with an electrical connection pad 20a in the die placement area A, and the other end is connected to the sheet-shaped circuit 200. For example, the width d1 of each of the linear conductive traces 201 is less than or equal to a width d3 of the electrical connection pad 20a, and the width d3 of the electrical connection pad 20a is less than the width do of the sheet-shaped circuit 200 (i.e., d1≤d3<d0). It should be understood that, if the width d1 of each of the linear conductive traces 201 is equal to the width d3 of the electrical connection pad 20a, a bump on trace (BOT) method can be used when applied to the packaging process.

Figure 2B:
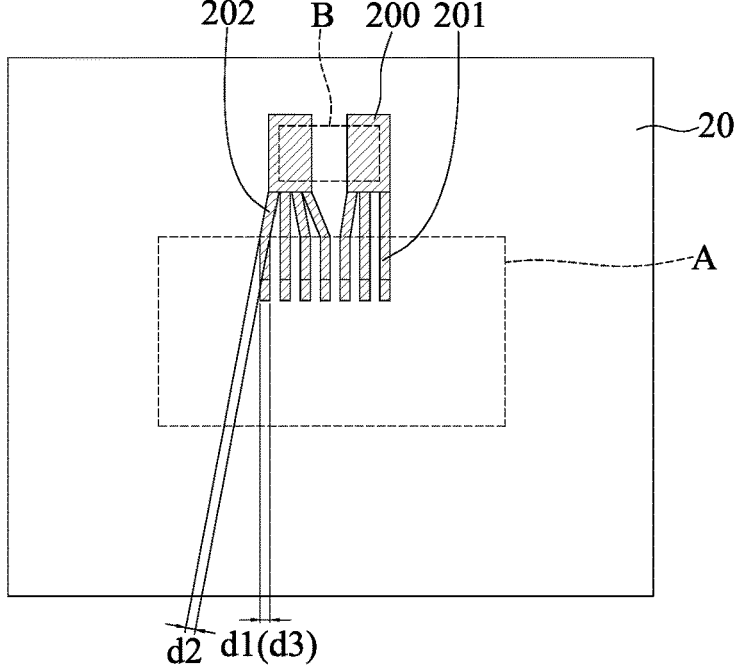
FIG. 2B is a schematic top view of another embodiment of FIG. 2A.

In addition, the other end of each of the linear conductive traces 201 is directly connected to the sheet-shaped circuit 200, that is, the sheet-shaped circuit 200 is formed in the functional area B and extends to the edge of the die placement area A. Alternatively, as shown in FIG. 2B, the other end of each of the linear conductive traces 201 is indirectly connected to the sheet-shaped circuit 200 via an auxiliary circuit 202 arranged outside the die placement area A and outside the functional area B, that is, the auxiliary circuit 202 is formed between the sheet-shaped circuit 200 and the die placement area A, wherein a width d2 of the auxiliary circuit 202 is less than or equal to the width d1 of each of the linear conductive traces 201 (i.e., d2≤d1≤d3<d0).

Figure 3A:
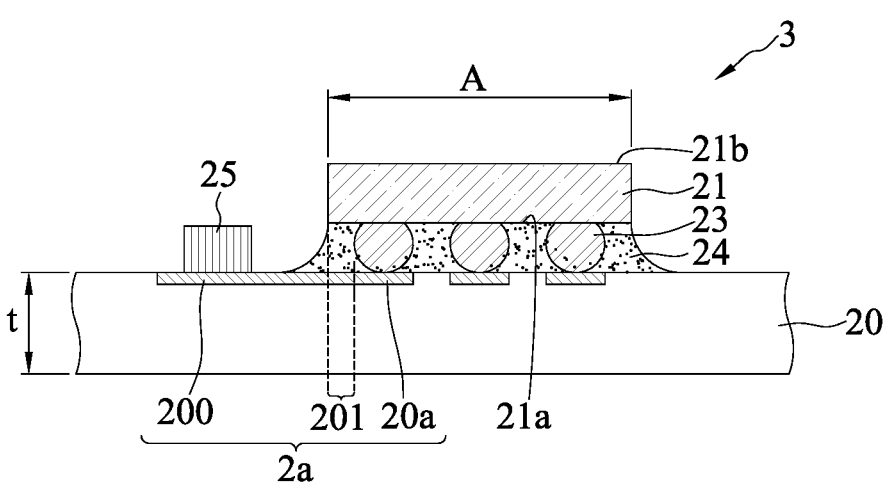
FIG. 3A is a schematic cross-sectional view of an electronic package according to the present disclosure.
Figure 3B:
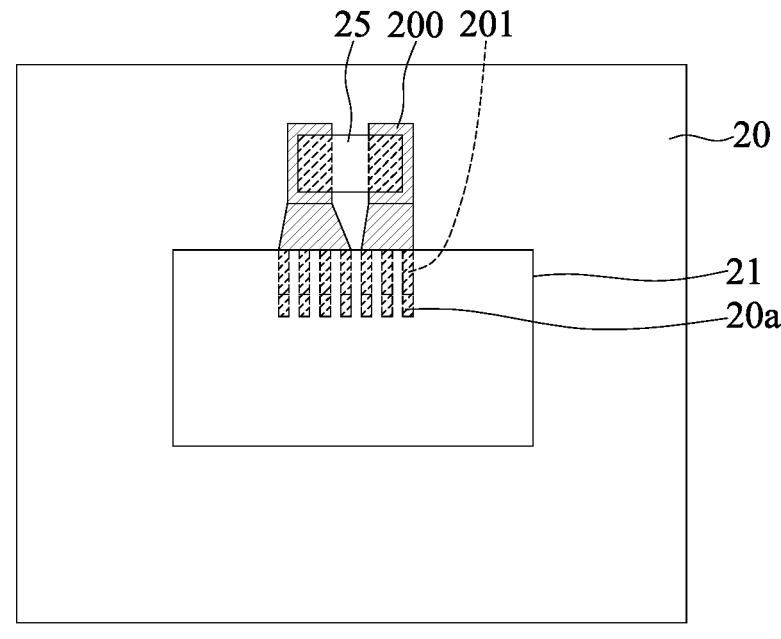
FIG. 3B is a schematic top view of the electronic package according to the present disclosure.

Therefore, in subsequent applications, in an electronic package 3 shown in FIG. 3A and FIG. 3B, at least one electronic element 21 can be disposed on the die placement area A of the substrate structure 20, and at least one passive element 25 can be disposed on the functional area B of the substrate structure 20, so that the electronic element 21 is electrically connected to the passive element 25 via the routing layer 2a (including the electrical connection pad 20a, the linear conductive traces 201 and the sheet-shaped circuit 200).

In an embodiment, the electronic element 21 is an active element such as a semiconductor chip. For example, the electronic element 21 has an active surface 21a and an inactive surface 21b opposite to each other, and the active surface 21a has a plurality of electrode pads, so that the electronic element 21 is electrically connected to a plurality of electrical connection pads 20a by means of a plurality of conductive bumps 23 containing solder material in a flip-chip manner, and then the conductive bumps 23 are covered with an underfill 24; alternatively, the electronic element 21 can also be electrically connected to the plurality of electrical connection pads 20a in a wire bonding manner by a plurality of bonding wires (not shown); or, the electronic element 21 can directly contact the plurality of electrical connection pads 20a. However, the manner in which the electronic element 21 is electrically connected to the plurality of electrical connection pads 20a is not limited to the above.

Furthermore, the passive element 25 is, for example, a resistor, a capacitor, or an inductor, and is electrically connected to the sheet-shaped circuit 200.

Therefore, in the electronic package 3 according to the present disclosure, through a design of the routing layer 2a of the substrate structure 2, the circuit in the die placement area A is designed as a linear conductive trace 201 with a smaller width, and the circuit outside the die placement area A is designed to be at least partially a sheet-shaped circuit 200 with a larger line width, so as to reduce a metal area on the surface of the substrate body 20 (especially a copper area corresponding to an underside of the electronic element 21). Therefore, compared with the prior art, the electronic package 3 can effectively disperse the stress of the substrate structure 2 during temperature cycles or stress changes, such as reflowing the conductive bumps 23, so as to avoid stress concentration on the routing layer 2a, thereby preventing the substrate structure 2 from warping too much.

Further, the substrate structure 2 according to the present disclosure can avoid the problem of separation of the plurality of conductive bumps 23 and the substrate structure 2 (or the electronic element 21) due to warping (even the conductive bumps 23 would break because they cannot withstand the stress concentration). Therefore, the electronic package 3 according to the present disclosure is beneficial to improve the reliability of the electrical connection between the electronic element 21 and the substrate structure 2, thereby increasing a production yield.

Furthermore, through a design of the routing layer 2a of the substrate structure 2, the substrate body 20 can avoid the problem of warpage when the thickness t thereof is less than 500 micrometers, so that the substrate structure 2 can not only meet the thinning requirements, and at the same time can meet the requirement of preventing warpage, especially when the thickness t of the substrate body 20 is 300 micrometers, it can better reflect the requirement of thinning and meet the requirement of preventing warpage. On the contrary, without the design of the routing layer 2a, when the thickness t of the substrate body 20 is less than 500 micrometers, warpage will easily occur. Especially when the thickness t of the substrate body 20 is 300 micrometers in order to meet the thinning requirements, the degree of warpage will be more obvious.

Figure 2C:
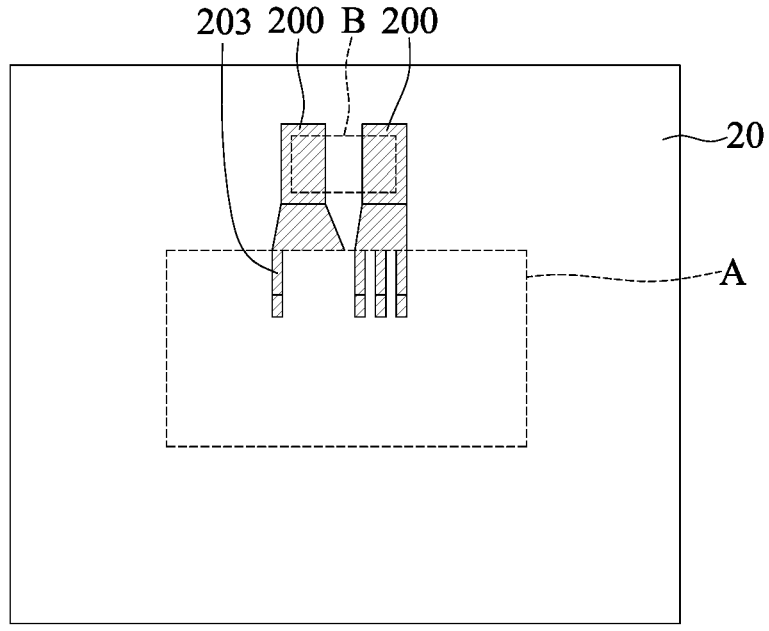
FIG. 2C is a schematic top view of another embodiment of FIG. 2A.

In addition, based on the electrical requirements between the passive element 25 and the electronic element 21, as long as the passive element 15 can achieve the expected function (such as capacitance), the design of the current path of the routing layer 2a can be changed according to needs. For example, the auxiliary circuit 202 is added as shown in FIG. 2B; or, as shown in FIG. 2C, a single sheet-shaped circuit 200 is connected to a single linear conductive trace 203.

In summary, in the electronic package and the substrate structure thereof according to the present disclosure, the circuit in the die placement area is designed as a linear conductive trace with a smaller line width, and the circuit outside the die placement area is designed to be a sheet-shaped circuit with a wider line width to reduce the metal area on the surface of the substrate body, so that the electronic package can effectively disperse the stress of the substrate structure and avoid the warpage of the substrate structure. Therefore, the present disclosure can avoid the problem of peeling of the conductive bumps, so as to improve the reliability of the electrical connection between the electronic element and the substrate structure, thereby improving the production yield.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. A substrate structure, comprising:
   a substrate body having a surface defined with a die placement area and a functional area separated from each other; and
   a routing layer including a plurality of linear conductive traces arranged in the die placement area and a plurality of sheet-shaped circuits arranged in the functional area and electrically connected to the plurality of linear conductive traces, wherein each of the linear conductive traces has a width less than a width of each of the sheet-shaped circuits;
   wherein one end of the plurality of linear conductive traces is formed with a plurality of electrical connection pads located in the die placement area, and the other end of the plurality of linear conductive traces is connected to the plurality of sheet-shaped circuits.

2. The substrate structure of claim 1, wherein the substrate body has a thickness less than 500 micrometers.

3. The substrate structure of claim 2, wherein the thickness of the substrate body is 300 micrometers.

4. The substrate structure of claim 1, wherein one of the plurality of sheet-shaped circuits is connected to at least two of the plurality of linear conductive traces.

5. The substrate structure of claim 1, wherein the routing layer is an outermost circuit layer of the substrate body.

6. The substrate structure of claim 1, wherein the plurality of linear conductive traces are only located in the die placement area and are not formed outside the die placement area.

7. The substrate structure of claim 1, wherein the width of each of the linear conductive traces is less than or equal to a width of each of the electrical connection pads, and the width of each of the electrical connection pads is less than the width of each of the sheet-shaped circuits.

8. The substrate structure of claim 1, wherein each of the linear conductive traces is connected to each of the sheet-shaped circuits by an auxiliary circuit, and the auxiliary circuit is arranged outside the die placement area and the functional area, wherein the auxiliary circuit has a width less than or equal to the width of each of the linear conductive traces.

9. An electronic package, comprising
   the substrate structure of claim 1;
   an electronic element disposed on the die placement area and electrically connected to the plurality of linear conductive traces; and
   a passive element disposed on the functional area and electrically connected to the plurality of sheet-shaped circuits.

10. The electronic package of claim 9, wherein the substrate body has a thickness less than 500 micrometers.

11. The electronic package of claim 9, wherein the substrate body has a thickness of 300 micrometers.

12. The electronic package of claim 9, wherein one of the plurality of sheet-shaped circuits is connected to at least two of the plurality of linear conductive traces.

13. The electronic package of claim 9, wherein the routing layer is an outermost circuit layer of the substrate body.

14. The electronic package of claim 9, wherein the plurality of linear conductive traces are only located in the die placement area and are not formed outside the die placement area.

15. The electronic package of claim 9, wherein the width of each of the linear conductive traces is less than or equal to a width of each of the electrical connection pads, and the width of each of the electrical connection pads is less than the width of each of the sheet-shaped circuits.

16. The electronic package of claim 9, wherein the electronic element is electrically connected to the plurality of electrical connection pads.

17. The electronic package of claim 9, wherein the electronic element is electrically connected to the plurality of linear conductive traces via a plurality of conductive bumps.

18. The electronic package of claim 9, wherein each of the linear conductive traces is connected to each of the sheet-shaped circuits by an auxiliary circuit, and the auxiliary circuit is arranged outside the die placement area and the functional area, wherein the auxiliary circuit has a width less than or equal to the width of each of the linear conductive traces.

* * * * *